United States Patent
Louis et al.

(10) Patent No.: US 6,744,316 B2
(45) Date of Patent: Jun. 1, 2004

(54) METHOD AND APPARATUS FAR REDUCTION OF DISTORTION IN A TRANSMITTER

(75) Inventors: Edward Vincent Louis, St. Charles, IL (US); Michael David Leffel, Crystal Lake, IL (US)

(73) Assignee: Motorola, Inc., Schaumburg, IL (US)

(*) Notice: Subject to any disclaimer, the term of this patent is extended or adjusted under 35 U.S.C. 154(b) by 24 days.

(21) Appl. No.: 09/837,850

(22) Filed: Apr. 19, 2001

(65) Prior Publication Data

US 2002/0153952 A1 Oct. 24, 2002

(51) Int. Cl.[7] .............................................. H03F 1/26
(52) U.S. Cl. ...................................... 330/151; 330/149
(58) Field of Search ................................. 330/149, 151; 375/297

(56) References Cited

U.S. PATENT DOCUMENTS

| | | | | |
|---|---|---|---|---|
| 5,489,875 A | * | 2/1996 | Cavers ........................ 330/151 |
| 5,617,061 A | * | 4/1997 | Fukuchi ....................... 330/151 |
| 5,831,479 A | | 11/1998 | Leffel et al. ................. 330/124 |
| 5,874,856 A | | 2/1999 | Van Horn .................... 330/151 |
| 6,069,531 A | * | 5/2000 | Myer .......................... 330/149 |
| 6,104,241 A | * | 8/2000 | Cova et al. .................. 330/149 |
| 6,232,837 B1 | * | 5/2001 | Yoo et al. ..................... 330/151 |
| 6,275,105 B1 | * | 8/2001 | Ghannouchi et al. ......... 330/149 |
| 6,417,731 B1 | * | 7/2002 | Funada et al. ............... 330/151 |

OTHER PUBLICATIONS

James K. Cavers; "Adaptation Behavior of a Feedforward Amplifier Linearizer"; IEEE Transactions on Vehicular Technology, vol. 44, No. 1, Feb. 1995, pp. 31–39.

* cited by examiner

Primary Examiner—Khanh Van Nguyen
(74) Attorney, Agent, or Firm—Steven A. May

(57) ABSTRACT

A transmitter includes a feed forward amplifier that includes main signal path having a radio frequency (RF) power amplifier, a feed forward correction circuit, and a control circuit. An amplification of an input signal by the RF power amplifier produces an amplified signal that includes a distortion component. The feed forward correction circuit produces an error signal, which error signal is used to drive an error amplifier to produce an amplified error signal. In order to minimize a distortion component introduced to the amplified error signal by the error amplifier, the control circuit controls a peak power of the error signal based on a detected energy of an attenuated version of the error signal or based on the distortion component introduced to the amplified error signal by the error amplifier.

12 Claims, 5 Drawing Sheets

200~# METHOD AND APPARATUS FAR REDUCTION OF DISTORTION IN A TRANSMITTER

FIELD OF THE INVENTION

The present invention relates generally to wireless communication devices, and in particular to a transmitter portion of a wireless communication device.

BACKGROUND OF THE INVENTION

The frequency spectrum that is shared among radio communication devices is limited. Thus the ability of a transmitter to transmit as much information as possible in an allocated frequency spectrum or channel without interfering with other communication devices in adjacent channels is of great importance. To transmit as much information as possible in the allocated channel, digital communication systems typically modulate both the amplitude and phase of a radio frequency (RF) carrier. The amplitude modulation allows more information to be encoded on the carrier in a given channel than if only the phase was modulated. However, the amplitude modulation puts additional requirements on the transmitter that would not exist if only the phase of the RF carrier was modulated.

These additional requirements are due to the inherent nonlinear effects resulting from the amplification of an amplitude modulated signal by an RF power amplifier. Due to the nonlinear characteristics of the RF power amplifier, signal distortion components that include an amplitude component and a phase component are added to the original signal. These additional components are due to the amplitude compression characteristics (AM/AM) and the phase distortion (AM/PM) characteristics of the RF power amplifier when it is driven over a range of amplitudes. If these distortion components are not compensated they will cause spreading of the spectrum into the adjacent channels and thus interfere with communication devices using adjacent channels.

A number of prior art signal processing techniques have been developed to compensate for the nonlinear characteristics of RF power amplifiers. One such technique involves the use of a feed forward correction circuit in a feed forward amplifier. In general, feed forward amplifiers separate out distortion components generated by the RF power amplifier to create an error signal. The error signal is then amplified and added to the RF power amplifier's output with an amplitude, phase, and delay adjusted for maximum cancellation of the distortion components. However, the amount of distortion reduction available in a feed forward amplifier is limited by the distortion introduced into the error signal when the error signal is amplified by an error amplifier.

For example, FIG. 1 is a block diagram of an exemplary feed forward amplifier 100 of the prior art. Feed forward amplifier 100 includes a main signal path 102, a feed forward correction circuit 104, and a control circuit 106. An input signal 101 having carrier components is sourced to main signal path 102, where the signal is routed to a gain and phase adjuster 110 via an input signal coupler 108. Gain and phase adjuster 110 adjusts the amplitude and phase of input signal 101 based on a control signal received from control circuit 106. Gain and phase adjuster 110 conveys the amplitude and phase adjusted input signal to a radio frequency (RF) power amplifier 112 that amplifies the signal to produce an amplified signal 113. RF power amplifier 112 then conveys amplified signal 113 to an output signal coupler 120 via a signal coupler 116 and a delay circuit 118. As mentioned above, RF power amplifier 112 introduces distortion components to the amplified signal, which distortion components are partially cancelled by an error signal output by feed forward correction circuit 104.

Feed forward correction circuit 104 produces the error signal based on input signal 101 and amplified signal 113. A summation junction 124 included in feed forward correction circuit 104 receives a portion of input signal 101 from input signal coupler 108 via delay circuit 122 and further receives a portion of amplified signal 113 from signal coupler 116. Summation junction 124 subtracts the received portion of the amplified signal from the received portion of the input signal to produce an error signal 125. The subtraction results in a partial cancellation of the carrier components of the received portion of amplified signal by the carrier components of the received portion of the input signal. As a result, error signal 125 primarily contains the distortion components of the received portion of the amplified signal.

Summation junction 124 then conveys error signal 125 to a feed forward correction circuit error amplifier 130 via a feed forward signal coupler 126 and a feed forward gain and phase adjuster 128. Error amplifier 130 amplifies the received error signal to produce an amplified error signal 131 and conveys the amplified error signal to output signal coupler 120. Output signal coupler 120 combines amplified error signal 131 with amplified signal 113 to partially cancel the distortion components of amplified signal 113 and produce a distortion reduced output signal 121.

Amplification of error signal 125 by error amplifier 130 may result in an introduction of distortion components to the error signal due to the amplitude compression and the phase distortion characteristics of the error amplifier. Since amplified error signal 131 is combined with amplified signal 113 at output signal coupler 120, it is desirable to minimize the added distortion. In order to reduce the distortion introduced into amplified error signal 131 by error amplifier 130, control circuit 106 controls an average power of an error amplifier drive signal, that is, error signal 125.

Control circuit 106 receives a portion of error signal 125, that is, attenuated error signal 127, from feed forward signal coupler 126. Attenuated error signal 127 is routed to an average power detector 132, which determines an average power of the attenuated error signal. A controller 134 coupled to power detector 132 reads the average power determined by detector 132 and, based on the average power, conveys a control signal to gain and phase adjuster 110 that minimizes the average power detected by detector 132. By controlling the amplitude and phase adjustment of input signal 101 by gain and phase adjuster 110, control circuit 106 exerts control over an average power of error signal 125 and thereby over an average power of the drive signal applied to error amplifier 130.

However, control of an average power of error signal 125 does not necessarily minimize the distortion introduced into the amplified error signal by error amplifier 130. By controlling the average power of the error amplifier drive signal, the prior art provides sub-optimal reduction of distortion introduced by feed forward correction circuit 104 as the prior art fails to minimize the peak power of the error amplifier drive signal. Therefore a need exists for a method and apparatus for minimizing the distortion introduced into a feed forward amplifier by the feed forward correction circuit.

DESCRIPTION OF A PREFERRED EMBODIMENT

Figure 1:
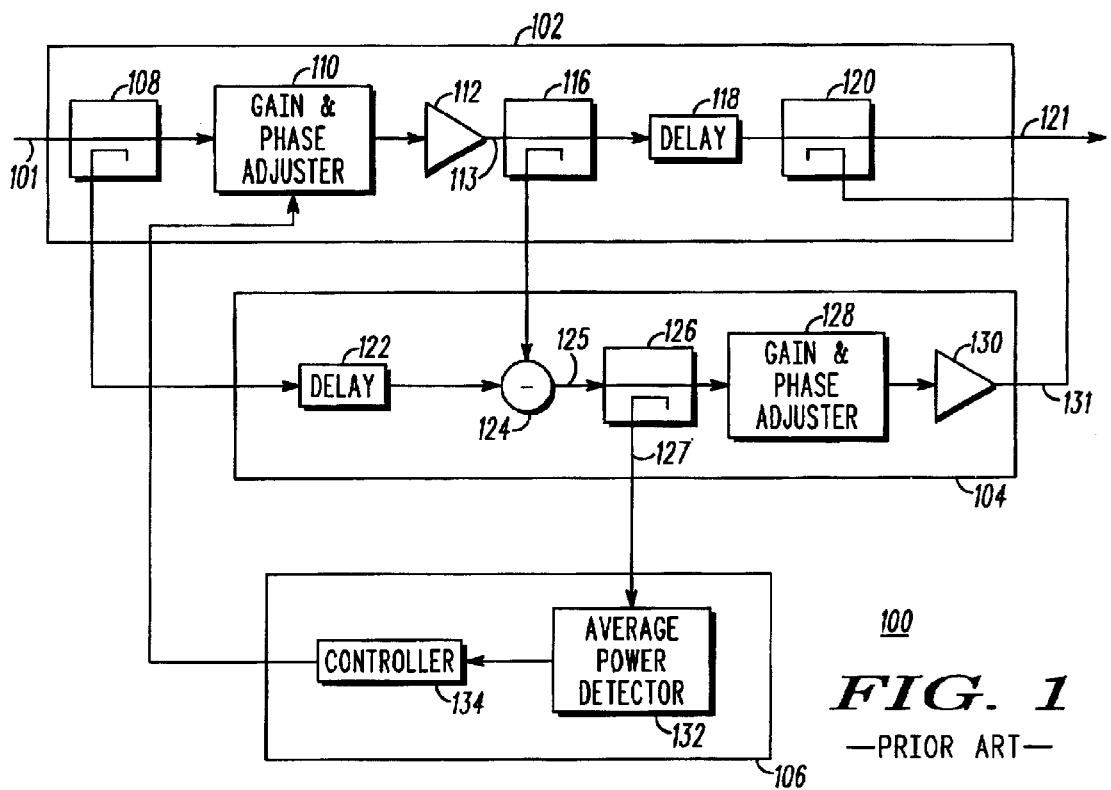
FIG. 1 is a block diagram of a feed forward amplifier of the prior art.

To address the need for a method and apparatus for minimizing the distortion introduced into a feed forward amplifier by the feed forward correction circuit, a transmitter includes a feed forward amplifier that includes a main signal path having a radio frequency (RF) power amplifier, a feed forward correction circuit, and a control circuit. An amplification of an input signal by the RF power amplifier produces an amplified signal that includes a distortion component. The feed forward correction circuit produces an error signal, which error signal is used to drive an error amplifier to produce an amplified error signal. The amplified error signal is then combined with the amplified signal in order to cancel the distortion component. In order to minimize a distortion component introduced to the amplified error signal by the error amplifier, the control circuit controls a peak power of the error signal based on a detected energy of an attenuated version of the error signal or based on the distortion component introduced to the amplified error signal by the error amplifier.

Generally, the present invention encompasses an apparatus for correcting distortion in an amplified error signal of a feed forward amplifier. The feed forward amplifier receives an input signal and amplifies the input signal to produce an amplified signal. The feed forward amplifier determines an error signal based on the input signal and the amplified signal and amplifies the error signal to produce the amplified error signal, which amplified error signal includes an error component and an error signal distortion component. The apparatus for correcting distortion in the amplified error signal comprises a control circuit that receives a portion of the error signal and produces a control signal based on the received portion of the error signal, wherein the control signal is capable of controlling an energy of a peak power of the error signal. By controlling the energy of the peak power of the error signal, the error signal distortion component can be reduced.

Another embodiment of the present invention encompasses a communication device having a transmitter that includes a main signal path, a feed forward correction circuit coupled to main signal path, and a control circuit coupled to each of the main signal path and the feed forward correction circuit. The main signal path receives an input signal, samples the input signal to produce an attenuated input signal, conveys the attenuated input signal to a feed forward correction circuit, amplifies the input signal to produce an amplified signal that comprises a distortion component, samples the amplified signal to produce an attenuated amplified signal, and conveys the attenuated amplified signal to the feed forward correction circuit. The feed forward correction circuit receives the attenuated input signal and the attenuated amplified signal from the main signal path, produces an error signal based on the attenuated input signal and the attenuated amplified signal, amplifies the error signal to produce an amplified error signal that comprises an error component and a distortion component, samples the error signal to produce an attenuated error signal, and conveys the attenuated error signal to a control circuit. The control circuit receives the attenuated error signal from the feed forward correction circuit, produces a control signal based the attenuated error signal, and conveys the control signal to the main signal path. Based on the control signal, the main signal path adjusts an amplitude and a phase of the input signal in order to control an energy of a peak power of the error signal and to reduce the distortion component of the amplified error signal.

Yet another embodiment of the present invention provides a method for reducing distortion in a transmitter having a feed forward amplifier, wherein the feed forward amplifier amplifies an input signal to produce an amplified signal. The method includes steps of sampling the input signal to produce an attenuated input signal and sampling the amplified signal to produce an attenuated amplified signal. The method further includes steps of combining the attenuated input signal with the attenuated amplified signal to produce an error signal and producing a control signal based on the error signal, wherein the control signal is capable of controlling an energy of the peak power of the error signal. The error signal is amplified to produce an amplified error signal that comprises an error component and a distortion component, and by controlling an energy of the peak power of the error signal, the distortion component of the amplified error signal can be minimized.

Still another embodiment of the present invention provides a method for reducing distortion in a transmitter having a feed forward amplifier. The method includes steps of receiving an input signal, amplifying the input signal to produce an amplified signal, and determining an error signal based on the input signal and the amplified signal. The method further includes steps of amplifying the error signal to produce an amplified error signal, wherein the amplified error signal comprises an error component and a distortion component, and producing a control signal based on the distortion component of the amplified error signal, wherein the control signal is capable of reducing distortion in the transmitter.

Figure 2:
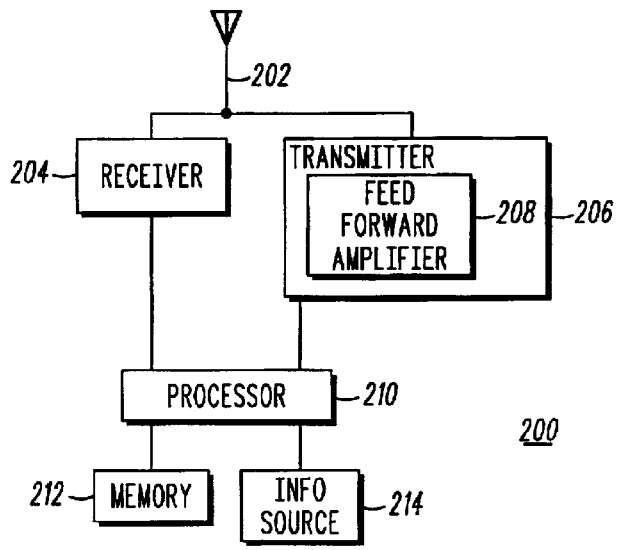
FIG. 2 is a block diagram of a communication device in accordance with an embodiment of the present invention.

The present invention may be more fully described with reference to FIGS. 2–7. FIG. 2 is a block diagram of a communication device 200 in accordance with an embodiment of the present invention. Preferably, communication device 200 includes a base transceiver station; however, alternatively communication device 100 may include any wireless communication device capable of wirelessly transmitting information, such as a cellular telephone, a radiotelephone, or a wireless modem. Communication device 200 includes an antenna 202 coupled to each of a receiver 204 and a transmitter 206 having a feed forward amplifier 208. Communication device 200 further includes a processor 210, such as a microprocessor or a digital signal processor (DSP), coupled to each of receiver 204 and transmitter 206 and further coupled to a memory 212 and an information source 214. Memory 212 stores programs executed by processor 210 in the operation of communication device 200. Information source 214 can include an interface with devices or networks external to communication device 200, or alternatively, in the case of a cellular telephone or a radiotelephone, may be a user interface, or in another alternative embodiment may be included in processor 210 and may be an application running on the processor.

Information source 214 or receiver 204 sources information to processor 210. Processor 210 processes the information in accordance with well-known signal processing techniques and then conveys a signal comprising the processed information to transmitter 206. Transmitter 206 modulates the information onto a radio frequency (RF) carrier to produce an RF signal and routes the RF signal to feed forward amplifier 208, which amplifies the signal for transmission via antenna 202.

Figure 3:
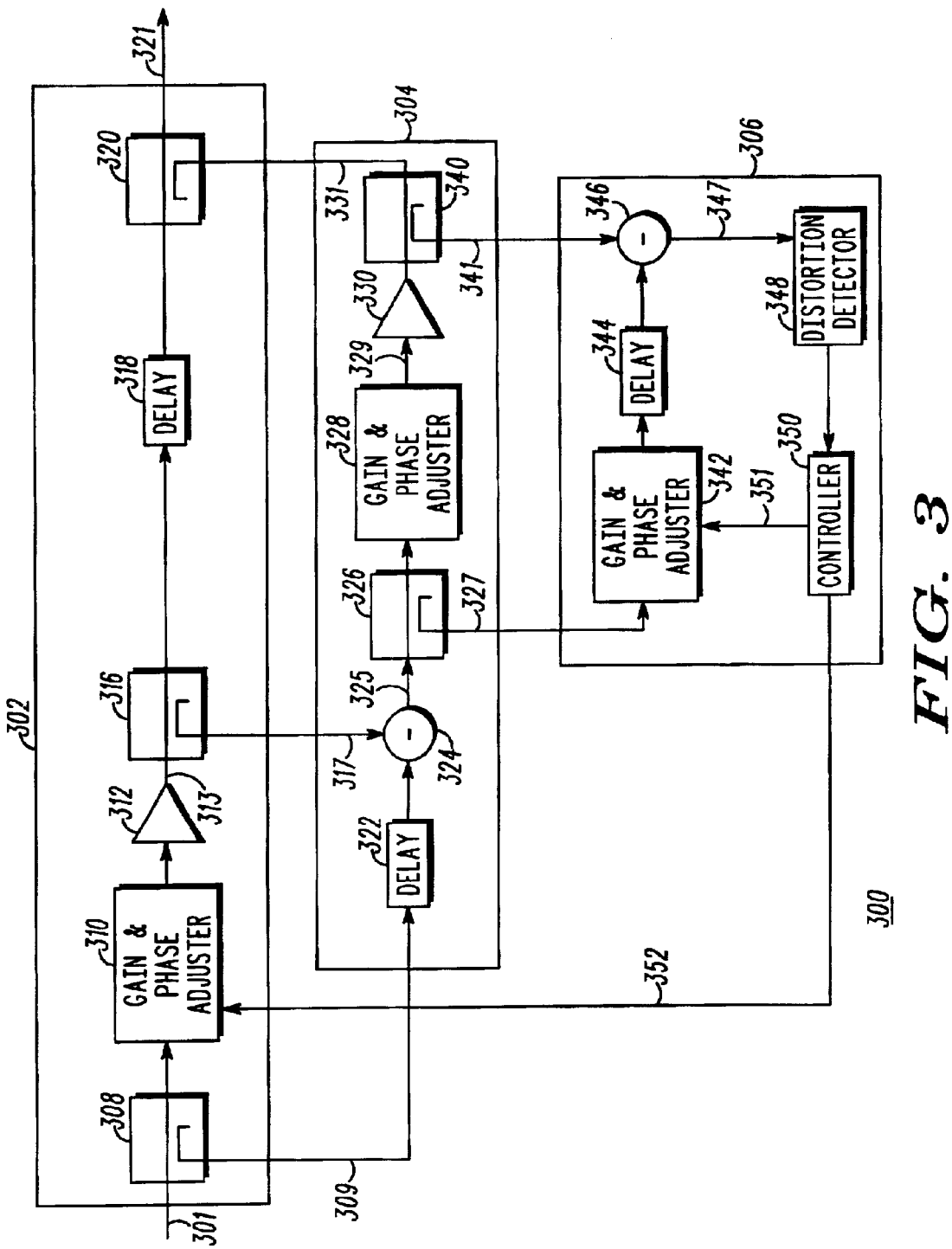
FIG. 3 is a block diagram of a feed forward amplifier in accordance with an embodiment of the present invention.

FIG. 3 is a block diagram of a feed forward amplifier 300 in accordance with an embodiment of the present invention. Feed forward amplifier 300 includes a main signal path 302 that is coupled to each of a feed forward correction circuit 304 and a control circuit 306. An RF signal 301 comprising carrier components is input into feed forward amplifier 300. Feed forward amplifier 300 routes input signal 301 to main signal path 302, where the input signal is conveyed to a gain and phase adjuster 310 via an input signal coupler 308, preferably a directional coupler. Gain and phase adjuster 310 adjusts the amplitude and phase of input signal 301 based on a control signal received from control circuit 306. Gain and phase adjuster 310 then conveys the amplitude and phase adjusted input signal to an RF power amplifier 312 coupled to gain and phase adjuster 310. RF power amplifier 312 includes an RF amplifying element such as a power transistor, input and output matching networks, and biasing and decoupling circuitry as are necessary to allow the functionality of the RF amplifying element and to bias the RF amplifying element class AB; however, those of ordinary skill in the art will realize that other biases, such as classes B or C, might be used here without departing from the spirit and scope of the present invention.

RF power amplifier 312 amplifies the amplitude and phase adjusted input signal to produce an amplified signal 313 that includes carrier components and further includes distortion components introduced into the amplified signal by the power amplifier. The distortion components are due to the amplitude compression characteristics and the phase distortion characteristics of RF power amplifier 312 when the power amplifier is driven over a range of amplitudes, and if not compensated may cause spreading of the spectrum into the adjacent channels and thus interfere with communication devices using adjacent channels. RF power amplifier 312 then conveys amplified signal 313 to an output signal coupler 320, preferably a directional coupler, via a signal coupler 316, preferably a directional coupler, coupled to the power amplifier, and a delay circuit 318 coupled to each of signal couplers 316 and 320. Each of signal couplers 308, 316, and 320 are further coupled to feed forward correction circuit 304.

In order to cancel the distortion components of amplified signal 313, feed forward correction circuit 304 produces an error signal based on input signal 301 and amplified signal 313. Input signal coupler 308 samples input signal 301 to produce an attenuated input signal 309 and conveys the attenuated input signal to a summation junction 324 included in feed forward correction circuit 304 via a delay circuit 322. A time delay of delay circuit 322 is set to compensate for a signal delay through gain and phase adjuster 310, amplifier 312, and signal coupler 316. Signal coupler 316 samples amplified signal 313 to produce an attenuated amplified signal 317 and conveys the attenuated amplified signal to summation junction 324.

Summation junction 324 combines attenuated amplified signal 317 with the delayed attenuated input signal 309, preferably subtracting signal 317 from signal 309, to produce an error signal 325. The subtraction of attenuated amplified signal 317 from the delayed attenuated input signal 309 results in a partial cancellation of carrier components of attenuated amplified signal 317 by attenuated input signal 309. As a result, error signal 325 primarily contains distortion components of attenuated amplified signal 317, which correspond to the distortion components of amplified signal 313.

Feed forward amplifier 300 then reduces the distortion components of amplified signal 313 based on error signal 325. Summation junction 324 conveys error signal 325 to an error amplifier 330 via a first feed forward signal coupler 326, preferably a directional coupler, coupled to the summation junction and a feed forward gain and phase adjuster 328 interposed between signal coupler 326 and the error amplifier. Feed forward gain and phase adjuster 328 adjusts an amplitude and a phase of error signal 325 to produce amplitude and phase adjusted error signal 329 and to facilitate maximum cancellation of the distortion components of amplified signal 313 at output signal coupler 320. Gain and phase adjuster 328 conveys adjusted error signal 329 to error amplifier 330, and the error amplifier amplifies the adjusted error signal 329 to produce an amplified error signal 331. Amplified error signal 331 includes error components that corresponds to an amplified version of error signal 325 and may further include error signal distortion components that are introduced into the amplified error signal due to non-linear characteristics of the error amplifier.

Error amplifier 330 conveys amplified error signal 331 to output signal coupler 320 via a second feed forward signal coupler 340, preferably a directional coupler. Output signal coupler 320 combines amplified error signal 331 and amplified signal 313, preferably subtracting amplified error signal 331 from amplified signal 313, to produce a distortion reduced output signal 321. Prior to subtraction, amplified signal 313 is time delayed via delay circuit 318. A time delay of delay circuit 318 is set to compensate for a signal delay through signal coupler 316, summation junction 324, first and second feed forward signal couplers 326, 340, gain and phase adjuster 328, and error amplifier 330.

Since amplified error signal 331 is combined with amplified signal 313 at output signal coupler 320 to produce output signal 321, output signal 321 may include the amplified carrier components, the distortion components introduced into the amplified signal by the power amplifier and not cancelled by the amplified error signal, and the error signal distortion components introduced into the amplified error signal by the error amplifier. Since it is desirable to minimize all distortion components of output signal 321, it is desirable to minimize the distortion introduced to the amplified error signal by error amplifier 330.

The prior art reduces distortion introduced into an amplified error signal by controlling an average power of the error signal. However, control of an average power of an error amplifier drive signal does not assure that the peak power of the drive signal, which drives the corresponding error amplifier furthest into gain compression resulting in the most severe AM/AM and AM/PM distortion, is minimized. In order to optimally reduce the distortion introduced into amplified error signal 331, control circuit 306 of feed forward amplifier 300 controls an energy of the peak power of the error amplifier drive signal 329. By controlling the energy of the peak power of the drive signal, the distortion introduced into amplified error signal 331, and thereby into output signal 321, can be minimized.

Control circuit 306 includes a gain and phase adjuster 342 coupled to signal coupler 326, a delay circuit 344 coupled to gain and phase adjuster 342, a summation junction 346 coupled to delay circuit 344 and signal coupler 340, a distortion detector 348 coupled to summation junction 346, and a controller 350 coupled to distortion detector 348 and gain and phase adjuster 342. First feed forward signal coupler 326 samples error signal 325 to produce an attenuated error signal 327 and conveys the attenuated error signal to gain and phase adjuster 342. Gain and phase adjuster 342 adjusts an amplitude and a phase of attenuated error signal 327 based on a control signal received from controller 350 and conveys the amplitude and phase adjusted attenuated error signal to summation junction 346 via delay circuit 344. A time delay of delay circuit 344 is set to compensate for a signal delay through first feed forward signal coupler 326, gain and phase adjuster 328, error amplifier 330, and signal coupler 340 relative to a signal delay through signal coupler 326 and gain and phase adjuster 342.

Second feed forward signal coupler 340 samples amplified error signal 340 to produce an attenuated amplified error signal 341 and conveys the attenuated amplified error signal to summation junction 346. Summation junction 346 combines attenuated amplified error signal 341 with the delayed, amplitude and phase adjusted attenuated error signal, preferably subtracting the attenuated amplified error signal from the delayed and adjusted attenuated error signal, to produce an error amplifier distortion signal 347. The combining of the two signals results in a partial cancellation of error components of attenuated amplified error signal 341 by the delayed, amplitude and phase adjusted attenuated error signal. As a result, error amplifier distortion signal 347 primarily includes distortion components of attenuated amplified error signal 341, which correspond to the error signal distortion components introduced to error signal 325 by error amplifier 330.

Summation junction 346 conveys error amplifier distortion signal 347 to distortion detector 348. Distortion detector 348 quantifies error amplifier distortion signal 347 so that the error amplifier distortion signal can be read by controller 350. For example, distortion detector 348 may include a power detector coupled to an analog-to-digital converter (A/D), wherein the power detector determines an energy of error amplifier distortion signal 347 and the A/D converts the determined energy to a digital signal that is read by controller 350. Examples of power detectors include an average, or RMS, power detector, a peak power detector, a log power detector such as an AD8313 logarithmic detector, available from Analog Devices, Inc., and associated circuitry that is necessary to allow the functionality of the log detector, or a hybrid of two or more of the average power, peak power, and log power detectors. By way of another example, distortion detector 348 may include an envelope detector coupled to an A/ID, wherein the envelope detector takes a Fast Fourier Transform (FFT) of error amplifier distortion signal 347 and conveys a spectral power density of the signal to controller 350 via the A/D. By way of yet another example, distortion detector 348 may include a phase detector coupled to an A/D, wherein the phase detector determines a phase of error amplifier distortion signal 347 and conveys the determined phase to controller 350 via the A/D. Controller 350 reads the quantified error amplifier distortion signal determined by distortion detector 348. Based on the quantified error amplifier distortion signal, controller 350 produces multiple control signals 351, 352 that are intended to minimize the quantified error amplifier distortion signal.

Controller 350 conveys a first control signal 351 of the multiple control signals to gain and phase adjuster 342. In response to a receipt of control signal 351, gain and phase adjuster 342 adjusts an amplitude and a phase of attenuated error signal 327 in order to maximize a cancellation of the error components of attenuated amplified error signal 341 by the attenuated error signal at summation junction 346. By maximizing a cancellation of the error components, an energy of error amplifier distortion signal 347 is reduced and the distortion component of attenuated amplified error signal 341 is better isolated in the error amplifier distortion signal.

Controller 350 conveys a second control signal 352 of the multiple control signals to gain and phase adjuster 310. In response to a receipt of control signal 352, gain and phase adjuster 310 adjusts an amplitude and a phase of input signal 301 such that an energy of error signal 325 is reduced, thereby reducing an energy of the drive signal 329 applied to error amplifier 330, reducing an energy of the error signal distortion components introduced into amplified error signal 331 by error amplifier 330, and further reducing the energy of error amplifier distortion signal 347.

By using control signal 351 to better isolate the distortion component of attenuated amplified error signal 341 that is included in error amplifier distortion signal 347, controller 306 is able to produce the control signals based on the distortion components of attenuated amplified error signal 341, and therefore based on the distortion components of amplified error signal 331. By using control signals 351 and 352 to reduce the quantified error signal distortion component read by the controller 350, control circuit 306 reduces the error signal distortion components introduced into amplified error signal 331 by error amplifier 330. By reducing the error signal distortion components introduced into amplified error signal 331 by error amplifier 330, control circuit 306 reduces the error signal distortion components added to output signal 321 by the amplified error signal and thereby reduces the distortion included in the output signal.

Figure 4:
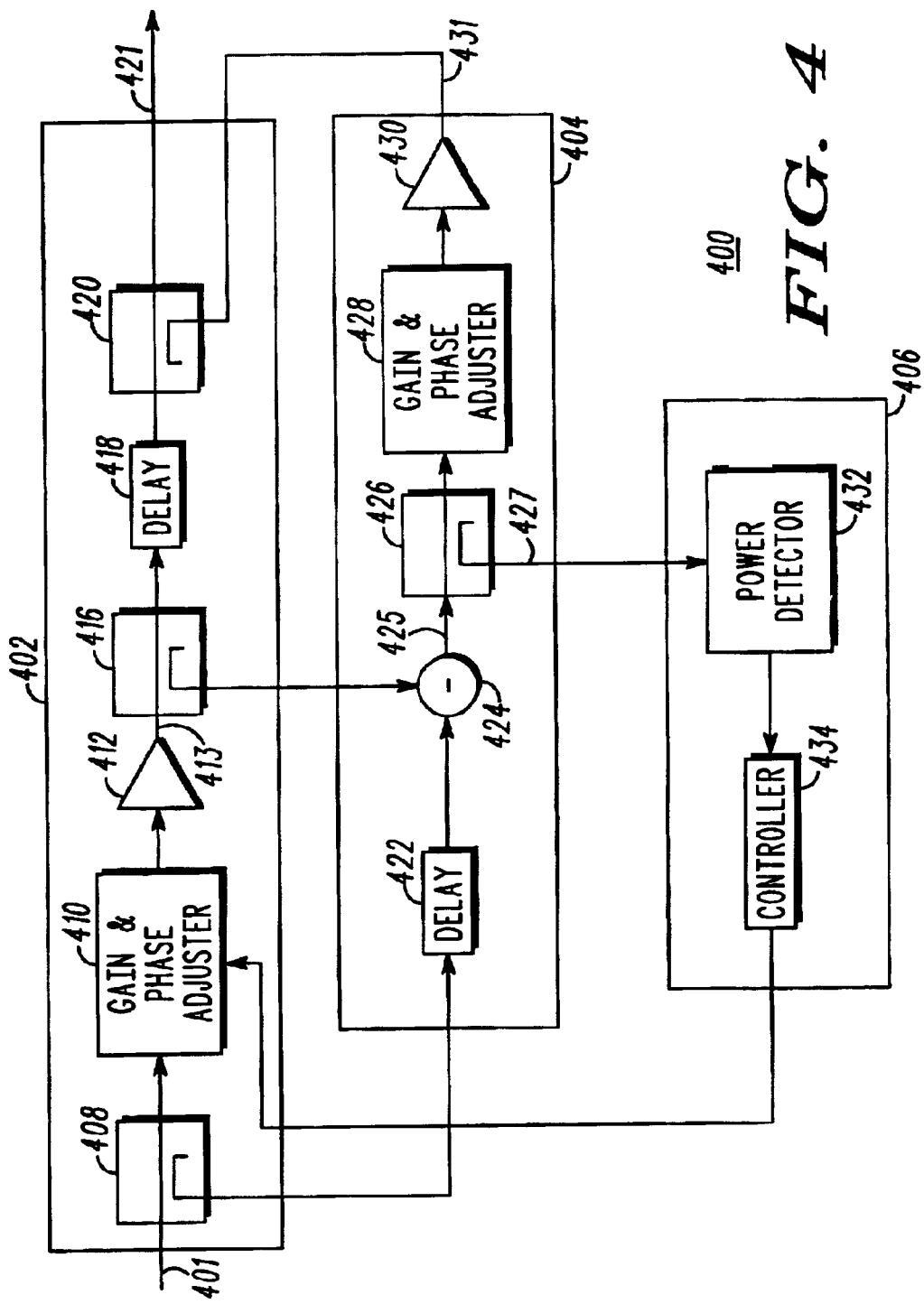
FIG. 4 is a block diagram of a feed forward amplifier in accordance with another embodiment of the present invention.

FIG. 4 is a block diagram of a feed forward amplifier 400 in accordance with another embodiment of the present invention. Feed forward amplifier 400 includes a main signal path 402, a feed forward correction circuit 404, and a control circuit 406. An RF signal 401 comprising carrier components is input into feed forward amplifier 400. Feed forward amplifier 400 routes input signal 401 to main signal path 402, where input signal 401 is routed to a gain and phase adjuster 410 via an input signal coupler 408, preferably a directional coupler. Gain and phase adjuster 410 adjusts the amplitude and phase of input signal 401 based on a control signal received from control circuit 406. The amplitude and phase adjusted input signal is routed to an RF power amplifier 412 coupled to gain and phase adjuster 410, where the signal is amplified to produce an amplified signal 413. Amplified signal 413 is then conveyed to an output signal coupler 420, preferably a directional coupler, via a signal coupler 416, preferably a directional coupler, coupled to RF power amplifier 412 and a delay circuit 418 coupled to each of signal couplers 416 and 420. Signal couplers 408, 416, and 420 are each further coupled to feed forward correction circuit 404.

Similar to RF power amplifier 312, RF power amplifier 412 includes an RF amplifying element such as a power transistor, input and output matching networks, and biasing and decoupling circuitry as are necessary to allow the functionality of the RF amplifying element and to appropriately bias the RF amplifying element. RF power amplifier 412 introduces distortion components into amplified signal 413, which distortion components are partially cancelled by an error signal output by feed forward correction circuit 404.

Feed forward correction circuit 404 receives a portion of input signal 401, that is, attenuated input signal 409, from input signal coupler 408. Attenuated input signal 409 is delayed by a delay circuit 422 and then routed to a summation junction 424 coupled to the delay circuit. Summation junction 424 further receives a portion of amplified signal 413, that is, attenuated amplified signal 417, from signal coupler 416. Summation junction 424 combines attenuated amplified signal 417 with, and preferably subtracts signal 417 from, the delayed attenuated input signal to produce an error signal 425. The combining of attenuated amplified signal 417 with the delayed attenuated input signal results in a partial cancellation of carrier components of attenuated amplified signal 417 by the delayed attenuated input signal. As a result, error signal 425 primarily contains distortion components of attenuated amplified signal 417, which correspond to the distortion components of amplified signal 413.

Summation junction 424 conveys error signal 425 to error amplifier 430 via a feed forward signal coupler 426 coupled to each of summation junction 424 and control circuit 406 and a feed forward gain and phase adjuster 428 coupled to each of signal coupler 426 and error amplifier 430. Feed forward gain and phase adjuster 428 adjusts the amplitude and phase of error signal 425. Error amplifier 430 amplifies the amplitude and phase adjusted error signal to produce an amplified error signal 431. Amplified error signal 431 includes error components that corresponds to an amplified version of error signal 425 and may further include distortion components that are introduced into the amplified error signal due to non-linear characteristics of error amplifier 430. Error amplifier 430 conveys the amplified error signal 431 to output signal coupler 420. Output signal coupler 420 combines amplified error signal 431 with amplified signal 413 to reduce the distortion components of amplified signal 421.

Control circuit 406 controls an energy of a peak power of an error amplifier drive signal in order to reduce the distortion introduced into amplified error signal 431 by error amplifier 430. Control circuit 406 receives a portion of error signal 425, that is, attenuated error signal 427, from feed forward signal coupler 426 and routes the attenuated error signal to a power detector 432 that preferably includes a peak power detector or alternatively a log power detector or an envelope detector and that quantifies a peak power or an envelope power of the attenuated error signal. Controller 434 is coupled to power detector 432 and reads the power determined by detector 432. Controller 434 then conveys a control signal to gain and phase adjuster 410 based on the determined peak power, and gain and phase adjuster 410 adjusts an amplitude and a phase of input signal 401 based on the control signal. By controlling an adjustment of the amplitude and phase of input signal 401, control circuit 406 is able to control a cancellation of carrier components at summation junction 424 based on a peak power of error signal 425, and thereby control a peak power of the drive signal (i.e., error signal 425) applied to error amplifier 430.

Figure 5:
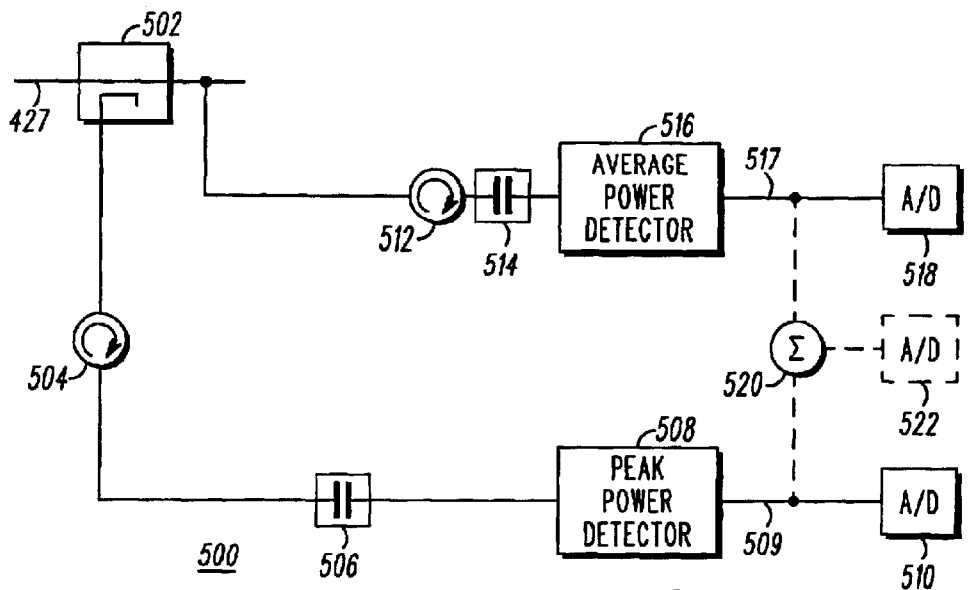
FIG. 5 is a schematic diagram of a peak power detector of FIG. 4 in accordance with another embodiment of the present invention.

In another embodiment of the present invention, power detector 432 may be a hybrid power detector comprised of an average power detector and a peak power detector. An exemplary hybrid power detector 500 is illustrated in FIG. 5. Hybrid power detector 500 receives attenuated error signal 427 from signal coupler 426. A signal coupler 502, preferably a directional coupler, included in hybrid power detector 500 samples attenuated error signal 427 to produce a first portion of attenuated error signal 427. The first portion of attenuated error signal 427 is conveyed to a peak power detector 508 via a circulator 504 coupled to the first signal coupler 502 and a coupling capacitor 506 coupled to the circulator and the peak power detector. Peak power detector 508 determines a peak envelope power of the first portion of the sampled signal and conveys a signal 509 corresponding to the determined peak envelope power to a first analog-to-digital converter (A/D) 510, which converts the peak envelope power to a digital signal that is read by controller 434.

A second portion of attenuated error signal 427 is conveyed to an average power detector 516 via a circulator 512 coupled to the second signal coupler 514 and a coupling capacitor 514 coupled to the circulator and the average power detector. Average power detector 516 determines an average power of the second sampled signal and conveys a signal 517 corresponding to the determined average power to a second A/D 518. Second A/D 518 converts the average power to a digital signal that is read by controller 434. Controller 434 then conveys a control signal to gain and phase adjuster 410 based on the determined peak and average powers. By controlling the amplitude and phase adjustment of input signal 401 by gain and phase adjuster 410, control circuit 406 is able to control a cancellation of carrier components at summation junction 424 based on a peak and an average power of error signal 425, and thereby control a peak power of the drive signal (i.e., error signal 425) applied to error amplifier 430.

In yet another example of a hybrid power detector, output signals 509 and 517 of peak power detector 508 and average power detector 516, respectively, can be summed before being conveyed to an A/D. For example, with reference to in FIG. 5, each of peak power detector 508 and average power detector 516 may be coupled to an A/D 522 via a summation junction 520. Output signals 509 and 517 are combined at summation junction 520 and the combined signal is then routed to A/D 522. A/D 522 converts the combined signals to a digital signal that is read by controller 434 and is used by controller 434 to convey a control signal to gain and phase adjuster 410.

By determining a peak power of attenuated error signal 427, which peak power corresponds to a peak power of error signal 425, control circuit 406 is able to control the peak power of the error signal and thereby reduce distortion in a transmitter. Error signal 425, after being amplitude and phase adjusted by amplitude and phase adjuster 428, serves as a drive signal for error amplifier 430. The peak power of error signal 425 is the portion of the error signal that causes the most sever gain compression, and therefore the most severe signal distortion, upon amplification of the error signal by error amplifier 430. Power detector 432 determines an energy of the attenuated error signal 427, and controller 434 produces a control signal based on the determined energy. Controller 434 conveys the control signal to gain and phase adjuster 410 in main signal path 402. Based on the control signal, gain and phase adjuster 410 adjusts an amplitude and a phase of input signal 401 such that an peak power of error signal 425, which error signal is produced by combining an amplified and attenuated version of the amplitude and phase adjusted input signal with an attenuated version of the input signal, is reduced. By reducing the peak power of error signal 425, the energy of attenuated error signal 427 is reduced and the peak power of the error amplifier drive signal is reduced, resulting in a reduction of the distortion component of amplified error signal 331 and a reduction of the energy of attenuated error signal 427.

Figure 6:
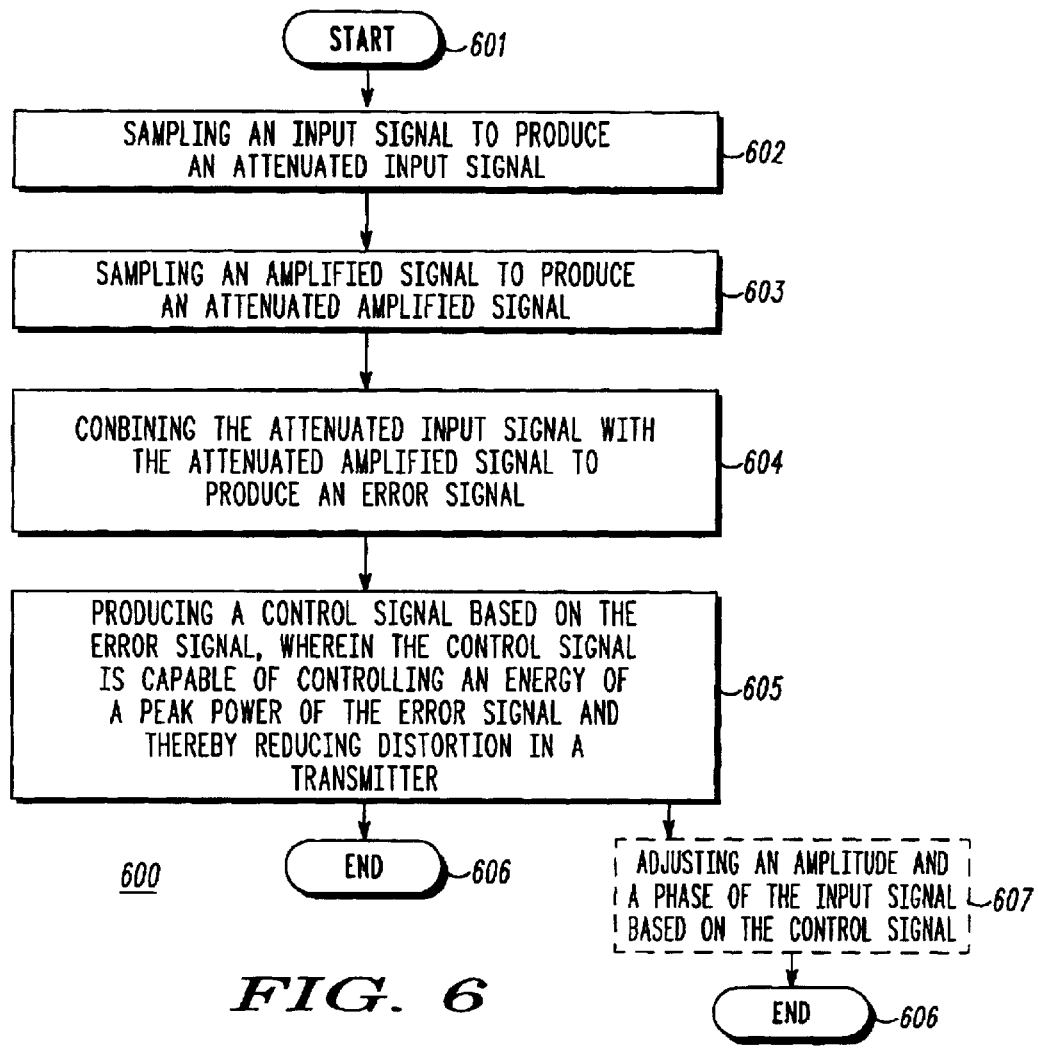
FIG. 6 is a logic flow diagram of steps executed by a transmitter to correct distortion in a feed forward amplifier in accordance with an embodiment of the present invention.

FIG. 6 is a logic flow diagram 600 of steps executed by transmitter 206 having a feed forward amplifier 208 in order to reduce distortion in the transmitter in accordance with an embodiment of the present invention. The feed forward amplifier includes an RF power amplifier 312, 412 that amplifies an input signal to produce an amplified signal. The logic flow begins (601) when the feed forward amplifier samples (602) the input signal to produce an attenuated input signal, samples (603) the amplified signal to produce an attenuated amplified signal, and combines (604) the attenuated input signal with the attenuated amplified signal to produce an error signal.

The feed forward amplifier preferably includes a main signal path, a feed forward correction circuit, and a control circuit. Preferably the step of sampling (602) the input signal to produce an attenuated input signal includes the following steps. The feed forward amplifier routes the input signal to the main signal path, where the input signal is routed to the RF power amplifier via a first main signal path signal coupler and a main signal path gain and phase adjuster. The first main signal path signal coupler samples the input signal to produce an attenuated input signal and conveys the attenuated input signal to the feed forward correction circuit.

The step of sampling (603) the amplified signal to produce an attenuated amplified signal then includes the following steps. The RF power amplifier amplifies the input signal to produce an RF power amplifier output signal. The RF power amplifier conveys the RF power amplifier output signal to a third main signal path signal coupler via a second main signal path signal coupler coupled to the RF power amplifier and a main signal path delay circuit coupled to each of the second and third main signal path signal couplers. The second signal coupler samples the RF power amplifier output signal to produce an attenuated RF power amplifier output signal and conveys the attenuated RF power amplifier output signal to the feed forward correction circuit. The step of combining (604) then includes the following steps. The feed forward correction circuit routes each of the attenuated input signal and the attenuated RF power amplifier output signal to a summation junction included in the feed forward correction circuit, preferably routing the attenuated input signal to the summation junction via a delay circuit. The feed forward correction circuit summation junction combines the attenuated input signal with the attenuated RF power amplifier output signal to produce an error signal.

The feed forward amplifier then produces (605) a control signal based on the error signal, wherein the control signal is capable of controlling an energy of a peak power of the error signal, and the logic flow ends (606). By controlling the energy of the peak power of the error signal, the feed forward amplifier controls a peak power of an error amplifier drive signal and reduces distortion in the transmitter. In another embodiment of the present invention, logic flow 600 further includes a step of adjusting (607) an amplitude of the input signal and a phase of the input signal based on the control signal.

In one embodiment of the present invention, the step of producing (605) a control signal includes the following steps. The feed forward correction circuit summation junction conveys the error signal to an error amplifier via a feed forward correction circuit signal coupler and a feed forward correction circuit gain and phase adjuster. The feed forward correction circuit signal coupler samples the error signal to produce an attenuated error signal and conveys the attenuated error signal to a control circuit that includes a power detector coupled to a controller. The power detector detects an energy of the peak power of the attenuated error signal, and the controller reads the detected energy and produces a control signal based on the detected energy.

The controller conveys the control signal to a gain and phase adjuster in the main signal path, which adjuster is interposed between the first signal coupler and the RF power amplifier. The gain and phase adjuster adjusts an amplitude and a phase of the input signal, which produces corresponding adjustments in an amplitude and a phase of the amplified signal and an energy of the peak power of the error signal. By reducing an energy of the peak power of the error signal, gain compression can be minimized in the amplification of the error signal by the error amplifier, thereby reducing the error signal distortion component and the energy of the peak power of the attenuated error signal.

In another embodiment of the present invention, the step of producing (605) a control signal based on a peak power of the error signal includes the following steps. The summation junction in the feed forward correction circuit conveys the error signal to an error amplifier via a first feed forward correction circuit signal coupler and a feed forward correction circuit gain and phase adjuster. The error amplifier amplifies the received error signal to produce an amplified error signal that includes error components and error signal distortion components. The error amplifier conveys the amplified error signal to a third main signal path signal coupler via a second feed forward correction circuit signal coupler. The third main signal path signal coupler combines the amplified error signal with the amplified signal to produce a feed forward amplifier output signal, which output signal includes the error signal distortion components introduced into the amplified error signal by the error amplifier.

The first feed forward correction circuit signal coupler samples the error signal to produce an attenuated error signal and conveys the attenuated error signal to a control circuit gain and phase adjuster included in the control circuit. The control circuit gain and phase adjuster adjusts an amplitude and a phase of the attenuated error signal based on a first control signal received from a controller coupled to the adjuster. The control circuit gain and phase adjuster then conveys the adjusted attenuated error signal to a control circuit summation junction via a delay circuit.

The second feed forward correction circuit signal coupler samples the amplified error signal to produce an attenuated amplified error signal and conveys the attenuated amplified error signal to the control circuit summation junction. The control circuit summation junction combines the adjusted attenuated error signal and the attenuated amplified error signal, preferably subtracting the former from the latter. The combining of the two signals produces a partial cancellation of error components of the attenuated amplified error signal and produces an error distortion signal that primarily includes distortion components of the attenuated amplified error signal, which distortion components correspond to the distortion components of the amplified error signal. The control circuit summation junction conveys the error distortion signal to a control circuit distortion detector that quantifies the error distortion signal. The quantified error distortion signal is read by a control circuit controller coupled to the distortion detector and the controller produces one or more control signals based on the quantified error distortion signal.

A first control signal of the one or more control signals is conveyed to the control circuit gain and phase adjuster. The control circuit gain and phase adjuster adjusts an amplitude and a phase of the attenuated error signal in order to maximize the cancellation of the error components of the attenuated amplified error signal with the attenuated error signal at the control circuit summation junction. A second control signal of the one or more control signals is conveyed to the main signal path gain and phase adjuster. The main signal path gain and phase adjuster adjusts an amplitude and a phase of the input signal, thereby adjusting an amplitude and a phase of the amplified signal, an amplitude and a phase of the attenuated amplified signal, and an energy of the peak power of the error signal. By reducing an energy of the peak power of the error signal, gain compression can be minimized in the amplification of the error signal by the error amplifier, thereby reducing the distortion component of the attenuated amplified error signal, reducing the quantified error distortion signal, and reducing the distortion included in the feed forward amplifier output signal.

Figure 7:
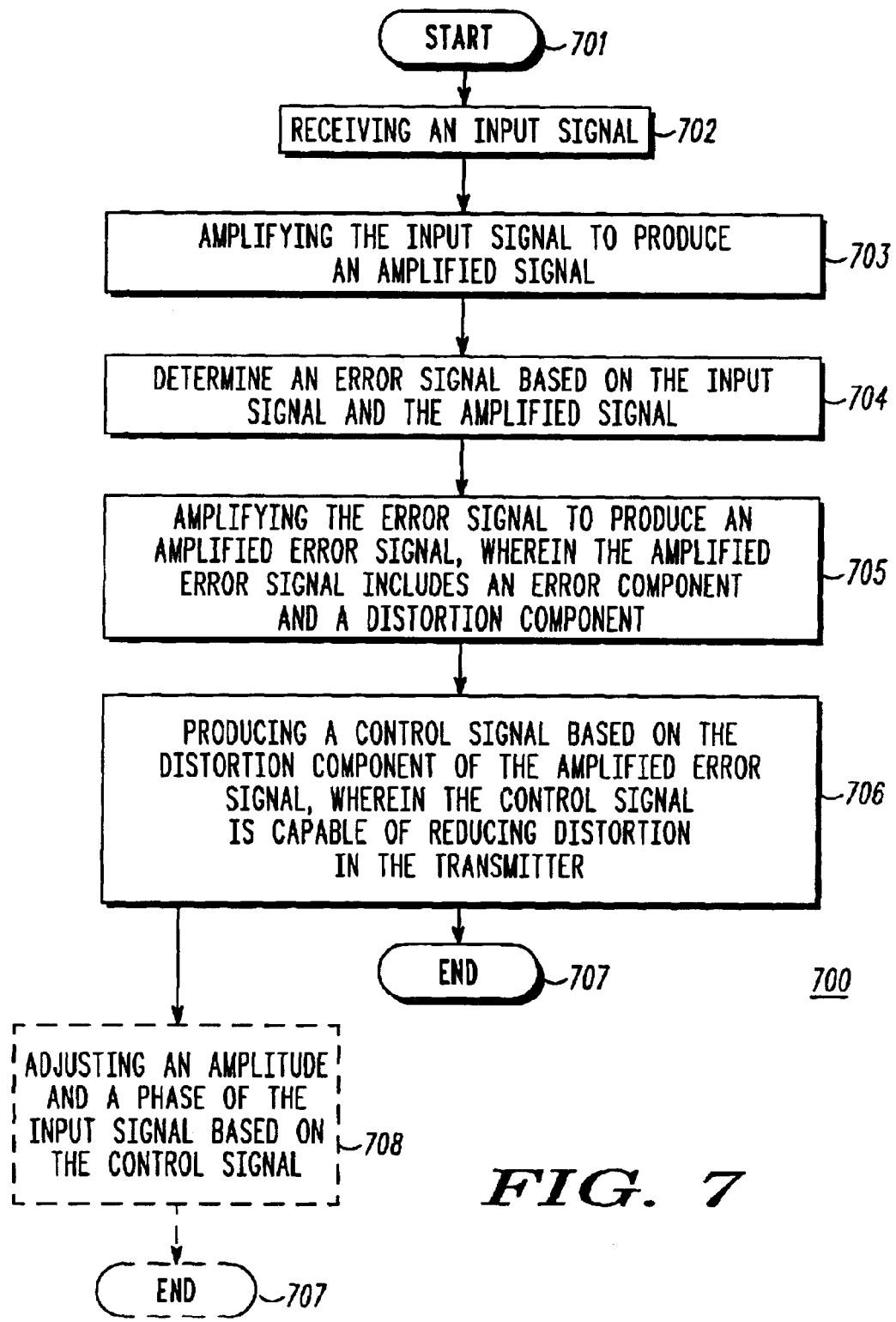
FIG. 7 is a logic flow diagram of steps executed by a transmitter having a feed forward amplifier in order to reduce distortion in the transmitter in accordance with another embodiment of the present invention.

FIG. 7 is a logic flow diagram 700 of steps executed by a transmitter having a feed forward amplifier in order to reduce distortion in the transmitter in accordance with another embodiment of the present invention. The logic flow begins (701) when the feed forward amplifier receives (702) an input signal and amplifies (703) the input signal to produce an amplified signal. The feed forward amplifier determines (704) an error signal based on the input signal and the amplified signal and amplifies (705) the error signal to produce an amplified error signal, wherein the amplified error signal comprises an error component and a distortion component. Based on the distortion component of the amplified error signal, the feed forward amplifier produces (706) a control signal that is capable of reducing distortion in the transmitter, and the logic flow ends (707). In another embodiment of the present invention, logic flow 700 further includes a step of adjusting (708) an amplitude of the input signal and a phase of the input signal based on the control signal.

Preferably, the step of determining (704) an error signal includes the following steps. The feed forward amplifier samples the input signal to produce an attenuated input signal and samples the amplified signal to produce an attenuated amplified signal. The feed forward amplifier then combines the attenuated input signal with the attenuated amplified signal to produce the error signal.

Preferably, the step of producing (706) a control signal includes the following steps. The feed forward amplifier samples the error signal to produce an attenuated error signal and samples the amplified error signal to produce an attenuated amplified error signal. The feed forward amplifier combines the attenuated error signal with the attenuated amplified error signal to produce an error distortion signal comprising a distortion component of the attenuated amplified error signal. Based on the error distortion signal, the feed forward amplifier produces a control signal capable of reducing distortion in the transmitter.

In sum, a transmitter that includes a feed forward amplifier reduces distortion in a transmitter output signal by reducing a distortion component of an amplified error signal, which amplified error signal is combined with an amplified input signal to produce the output signal. In turn, the distortion component amplified error signal is reduced by controlling a peak power of an error amplifier drive signal, which peak power corresponds to a peak power of an error signal. In one embodiment of the present invention, the peak power is controlled by detecting a peak power of an attenuated version of the error signal and generating a control signal based on the detected peak power. In another embodiment of the present invention, the peak power of the error amplifier drive signal is controlled by quantifying a distortion signal that includes a distortion component of an attenuated version of the amplified error signal, which distortion component corresponds to the distortion component of the amplified error signal, and generating a control signal based on the quantified distortion signal. The latter control signal is designed to minimize the quantified distortion signal, and thereby minimizes the peak power of the error amplifier drive signal and the distortion introduced by the amplified error signal into the output signal.

While the present invention has been particularly shown and described with reference to particular embodiments thereof, it will be understood by those skilled in the art that various changes may be made and equivalents substituted for elements thereof without departing from the spirit and scope of the invention. In addition, many modifications may be made to adapt a particular situation or material to the teachings of the invention without departing from the essential scope thereof. Therefore, it is intended that the invention not be limited to the particular embodiments disclosed herein, but that the invention will include all embodiments falling within the scope of the appended claims.

What is claimed is:

1. In a feed forward amplifier that receives an input signal and amplifies the input signal to produce an amplified signal, wherein the feed forward amplifier determines an error signal based on the input signal and the amplified signal, wherein the feed forward amplifier amplifies the error signal to produce an amplified error signal, and wherein the amplified error signal comprises an error component and an error signal distortion component, an apparatus for correcting distortion in the amplified error signal comprising:

a control circuit that receives a portion of the error signal, receives a portion of the amplified error signal, produces an error distortion signal based on the received portion of the error signal and the received portion of the amplified error signal, wherein the error distortion signal comprises a distortion component of the received portion of the amplified error signal, wherein the control circuit further quantifies the error distortion signal produces a control signal based on the quantified error distortion signal; and wherein the control signal is capable of controlling an adjustment of an amplitude of the input signal and a phase of the input signal, and wherein, by controlling an adjustment of the input signal, controlling the error signal distortion component.

2. The apparatus of claim 1, wherein the control signal comprises a plurality of control signals, wherein the control circuit produces the error distortion signal by combining the received portion of the error signal with the received portion of the amplified error signal, wherein prior to combining the signals and based on a first control signal of the plurality of control signals, the control circuit adjusts an amplitude and a phase of the received portion of the error signal in order to facilitate a cancellation of an error component of the received portion of the amplified error signal, and wherein a second control signal of the plurality of control signals is capable of controlling an energy of a peak power of the error signal.

3. The apparatus of claim 1, wherein the control circuit comprises:

a gain and phase adjuster that receives the portion of the error signal, adjusts an amplitude and a phase of the portion of the error signal to produce an amplitude and phase adjusted portion of the error signal, and conveys the amplitude and phase adjusted portion of the error signal to a summation junction;

a summation junction coupled to the gain and phase adjuster that receives the amplitude and phase adjusted portion of the error signal, receives the portion of the amplified error signal, and combines the amplitude and phase adjusted portion of the error signal with the portion of the amplified error signal to partially cancel an error component of the received portion of the amplified error signal and to produce an error distortion signal comprising a distortion component of the received portion of the amplified error signal;

a distortion detector coupled to the summation junction that quantifies the error distortion signal; and a controller coupled to the distortion detector that reads the quantified error distortion signal and produces the control signal based on the quantified error distortion signal.

4. The apparatus of claim 3, wherein the control signal comprises a plurality of control signals, wherein the controller conveys a first control signal of the plurality of control signals to the gain and phase adjuster, wherein, based on the first control signal, the gain and phase adjuster adjusts an amplitude of the portion of the error signal and a phase of the portion of the error signal based on the first control signal to facilitate a cancellation of an error component of the received portion of the amplified error signal, and wherein a second control signal of the plurality of control signals is capable of controlling an adjustment of an amplitude of the input signal and a phase of the input signal.

5. The apparatus of claim 3, further comprising a delay circuit interposed between the gain and phase adjuster and the summation junction that introduces a timing delay into the amplitude and phase adjusted portion of the error signal.

6. A feed forward amplifier comprising:

a main signal path that receives an input signal, samples the input signal to produce an attenuated input signal, conveys the attenuated input signal to a feed forward correction circuit, amplifies the input signal to produce an amplified signal that comprises a distortion component, samples the amplified signal to produce an attenuated amplified signal, and conveys the attenuated amplified signal to the feed forward correction circuit;

a feed forward correction circuit coupled to main signal path that receives the attenuated input signal and the attenuated amplified signal from the main signal path, produces an error signal based on the attenuated input signal and the attenuated amplified signal, amplifies the error signal to produce an amplified error signal that comprises an error component and a distortion component, samples the error signal to produce an attenuated error signal, samples the amplified error signal to produce an attenuated amplified error signal, and conveys the attenuated error signal and the attenuated amplified error signal to a control circuit;

a control circuit coupled to each of the main signal path and the feed forward correction circuit that receives the attenuated error signal and the attenuated error signal from the feed forward correction circuit, produces an error distortion signal based on the attenuated error signal and the attenuated amplified error signal, wherein the error distortion signal comprises a distortion component of the attenuated amplified error signal, quantifies the error distortion signal to produce a quantified error distortion signal, produces a control signal based the quantified error distortion signal, and conveys the control signal to the main signal path; and wherein, based on the control signal, the main signal path adjusts an amplitude and a phase of the input signal in order to control an energy of a peak power of the error signal and reduce the distortion component of the amplified error signal.

7. The feed forward amplifier of claim 6, wherein the control signal comprises a plurality of control signals, wherein the control circuit produces the error amplifier distortion signal by combining the attenuated error signal with the attenuated amplified error signal, wherein prior to combining the signals and based on a first control signal of the plurality of control signals, the control circuit adjusts an amplitude and a phase of the attenuated error signal in order to facilitate a cancellation of an error component of the attenuated amplified error signal, and wherein the control circuit conveys a second control signal of the plurality of control signals to the main signal path.

8. The feed forward amplifier of claim 6, wherein the feed forward correction circuit conveys a portion of the amplified error signal to the control circuit and wherein the control circuit comprises:

a gain and phase adjuster that receives the attenuated error signal and adjusts an amplitude and a phase of the attenuated error signal to produce an amplitude and phase adjusted attenuated error signal;

a summation junction coupled to the gain and phase adjuster that receives the amplitude and phase adjusted attenuated error signal, receives the attenuated amplified error signal, combines the amplitude and phase adjusted attenuated error signal with the attenuated amplified error signal to produce the error distortion signal;

a distortion detector coupled to the summation junction that quantifies the error distortion signal; and a controller coupled to the distortion detector that reads the quantified error distortion signal and produces the control signal based on the quantified error distortion signal.

9. The feed forward amplifier of claim 8, wherein the control signal comprises a plurality of control signals, wherein the controller conveys a first control signal of the plurality of control signals to the gain and phase adjuster, wherein, based on the first control signal, the gain and phase adjuster adjusts an amplitude of the attenuated error signal and a phase of the attenuated error signal in order to facilitate a cancellation of an error component of the attenuated amplified error signal, and wherein the controller conveys a second control signal of the plurality of control signals to the main signal path.

10. The feed forward amplifier of claim 8, further comprising a delay circuit interposed between the gain and phase adjuster and the summation junction that introduces a timing delay into the amplitude and phase adjusted portion of the error signal.

11. A method for reducing distortion in a transmitter having feed forward amplifier, wherein the feed forward amplifier amplifies an input signal to produce an amplified signal, the method comprising steps of:

sampling the input signal to produce an attenuated input signal;

sampling the amplified signal to produce an attenuated amplified signal;

combining the attenuated input signal with the attenuated amplified signal to produce an error signal;

sampling the error signal to produce an attenuated error signal;

amplifying the error signal to produce an amplified error signal;

sampling the amplified error signal to produce an attenuated amplified error signal;

producing an error distortion signal based on the attenuated error signal and the attenuated amplified error signal, wherein the error distortion signal comprises a distortion component of the attenuated amplified error signal;

quantifying the error distortion signal;

producing a control signal based on the quantified error distortion signal; and adjusting an amplitude of the input signal and a phase of the input signal based on the control signal.

12. The method of claim 11, wherein the control signal comprises a plurality of control signals, wherein the step of producing an error distortion signal comprises a step of combining the attenuated error signal with the attenuated amplified error signal to produce the error amplifier distortion signal, wherein the method further comprises a step of, prior to combining the signals and based on a first control signal of the plurality of control signals, adjusting an amplitude and a phase of the attenuated error signal in order to facilitate a cancellation of an error component of the attenuated amplified error signal, and wherein the step of adjusting an amplitude and a phase of the input signal based on the control signal comprises a step of adjusting an amplitude and a phase of the input signal based on second control signal of the plurality of control signals.

* * * * *